(12) United States Patent
Kim et al.

(10) Patent No.: US 12,457,807 B2
(45) Date of Patent: Oct. 28, 2025

(54) SPAD ESD PROTECTION DEVICE AND MANUFACTURING METHOD THEREOF

(71) Applicant: DB HiTek Co., Ltd., Bucheon-si (KR)

(72) Inventors: Jong Min Kim, Seoul (KR); Young Sang Son, Seoul (KR)

(73) Assignee: DB HiTek Co., Ltd., Bucheon-si (KR)

( * ) Notice: Subject to any disclaimer, the term of this patent is extended or adjusted under 35 U.S.C. 154(b) by 378 days.

(21) Appl. No.: 18/314,224

(22) Filed: May 9, 2023

(65) Prior Publication Data

US 2024/0290772 A1 Aug. 29, 2024

(30) Foreign Application Priority Data

Feb. 28, 2023 (KR) .................... 10-2023-0026467

(51) Int. Cl.
*H10D 89/60* (2025.01)
*H10D 10/60* (2025.01)

(52) U.S. Cl.
CPC ............. *H10D 89/60* (2025.01); *H10D 10/60* (2025.01)

(58) Field of Classification Search
None
See application file for complete search history.

(56) References Cited

U.S. PATENT DOCUMENTS

| | | | |
|---|---|---|---|
| 7,242,561 B2 | 7/2007 | Ker et al. | |
| 8,860,139 B2 | 10/2014 | Sawahata | |
| 9,177,949 B2 | 11/2015 | Sawahata | |
| 9,972,615 B1* | 5/2018 | Wang | H10D 30/603 |
| 2010/0230719 A1 | 9/2010 | Sawahata | |
| 2014/0339601 A1* | 11/2014 | Salcedo | H10D 89/713 |
| | | | 257/140 |
| 2015/0001679 A1 | 1/2015 | Sawahata | |
| 2015/0060937 A1* | 3/2015 | Hikasa | H10D 62/393 |
| | | | 257/139 |
| 2015/0236009 A1* | 8/2015 | Gill | H10D 62/115 |
| | | | 438/335 |
| 2016/0099240 A1* | 4/2016 | Chen | H10D 84/403 |
| | | | 438/236 |
| 2019/0103396 A1* | 4/2019 | Zhan | H10D 62/133 |

FOREIGN PATENT DOCUMENTS

JP 20100239119 A 10/2010

* cited by examiner

*Primary Examiner* — Alexander G Ghyka
(74) *Attorney, Agent, or Firm* — CENTRAL CALIFORNIA IP GROUP, P.C.; Andrew D. Fortney

(57) ABSTRACT

Disclosed are an ESD protection device to mitigate performance degradation due to operational instability by ensuring protection against ESD events and stress. The ESD protection device includes an N-type buried layer including a first dopant type in a semiconductor substrate, a deep well (DNW) including a first dopant type on the N-type buried layer, a first doped region including a first dopant type on the deep well, a second doped region including a first dopant type and a third doped region including a second dopant type, spaced apart from the first doped region, a base in the first doped region, and a multi-finger structure including emitter fingers in the second doped region and collector fingers in the third doped region, and a base moat comprising a base metal connecting individual ones of the emitter fingers to each other.

19 Claims, 15 Drawing Sheets

SPAD ESD PROTECTION DEVICE AND MANUFACTURING METHOD THEREOF

CROSS REFERENCE TO RELATED APPLICATION

The present application claims priority to Korean Patent Application No. 10-2023-0026467, filed Feb. 28, 2023, the entire contents of which are incorporated herein for all purposes by this reference.

BACKGROUND OF THE INVENTION

Field of the Invention

The present disclosure relates to an electrostatic discharge (ESD) protection device and a manufacturing method thereof seeking to protect high-voltage input/output (I/O) terminals or power terminals against ESD stress and mitigate performance degradation due to operational instability.

Description of the Related Art

For various reasons, semiconductor devices may be exposed to high voltage electrostatic discharge (ESD), which may have an instantaneous voltage of 2000V or more. Since ESD seriously affects device reliability, preventing ESD in semiconductor devices is a very important issue.

An ESD protection device may prevent damage caused by such ESD (e.g., static electricity). In order to fundamentally improve ESD damage prevention characteristics, a larger protection device may be useful. However, recently, as electronic devices are becoming highly integrated, the chip size continues to decrease. Accordingly, the size of an ESD protection device should be equally reduced. Yet, there are many difficulties in reducing the size of the ESD protection device, while maintaining ESD immunity. Ideally, the ESD protection device does not operate during normal operation of a circuit (i.e., when no ESD event occurs, the ESD protection device does not operate), so as not to slow down or negatively affect the rest of the circuitry.

In general, metal-oxide-semiconductor field-effect transistors (MOSFETs), bipolar transistors, and thyristors are used as ESD protection devices. For example, an ESD protection device using an NPN bipolar transistor is disclosed in Japanese Patent Application Publication No. JP2010-239119A (Oct. 21, 2010). In this case, concentration of current flowing from an emitter diffusion layer is suppressed and ESD tolerance is improved by separating current paths between the emitter diffusion layer and a terminal to which the ESD surge is applied, and providing a current-controlled resistor in each path.

Still, regarding conventional ESD protection devices, efforts are continuously being made to improve device performance as well as operational stability, and research on PNP-based ESD protection devices having different configurations from the NPN-based ESD protection device of the above related art also continues.

Document of Related Art

JP2010-239119 (published Oct. 21, 2010).

SUMMARY OF THE INVENTION

The present disclosure is directed to providing an electrostatic discharge (ESD) protection device and a manufacturing method thereof, which provide improved operational stability.

In particular, an objective of the present disclosure is to provide stable performance by improving the layout of a PNP-type ESD protection device to ensure uniform turn-on characteristics.

Objectives of the present disclosure are not limited to the ones mentioned above, and other objectives not mentioned may be understood by those skilled in the art from the following description.

According to one or more embodiments of the present disclosure, there is provided an ESD protection device including an N-type buried layer including a first dopant type in a semiconductor substrate; a deep well (DNW) including a first dopant type on the N-type buried layer; a first doped region including a first dopant type on the deep well; a second doped region including a first dopant type and a third doped region including a second dopant type, spaced apart from the first doped region; a base in the first doped region, and a multi-finger structure comprising emitter fingers in the second doped region, and collector fingers in the third doped region; a base moat comprising a base metal electrically connecting individual ones of the emitter fingers to each other, wherein the base metal may be in a floating state.

The first doped region, the second doped region, and the third doped region each may include a low concentration doped region and a high concentration doped region.

The base may comprise a ring structure along a periphery of the multi-finger structure, wherein each of the emitter fingers may be connected to the ring structure by a metal.

The ESD protection device may further comprise an ISO well under the ring structure (e.g., in the first doped region) and a base well under each emitter finger (e.g., in the second doped region), connected to each other by a further well having the first dopant type.

In the ESD protection device, when the base well under any one of the emitter fingers is driven with a first voltage different from that of the ring or the other emitter fingers, all of the base wells may be driven with the first voltage.

The emitter fingers and the ring may be interconnected together.

The base moat may further comprise a mutually connected base node.

The ESD protection device may further comprise an external resistor between at least one of the emitter fingers and the mutually connected base node.

The external resistor may control a triggering voltage for triggering the base well below the at least one emitter finger.

The external resistor may comprise a poly resistor, a diffusion resistor, a well resistor, a salicide resistor, or a metal resistor.

According to another embodiment of the present disclosure, there is provided an ESD protection device including an N-type buried layer including a first dopant type in a semiconductor substrate; a deep well (DNW) including a first dopant type on the N-type buried layer; a first doped region including a first dopant type on the deep well; a second doped region including a first dopant type and a third doped region including a second dopant type, spaced apart from the first doped region; an ISO ring formed in the first doped region, configured to function as a base, and a multi-finger structure comprising emitter fingers and collector fingers; and a base moat comprising a base metal connecting individual ones of the emitter fingers to each other, wherein a base well in or below at least one of the emitter fingers may be connected to a well below the ISO ring (e.g., in the first doped region).

The ESD protection device may comprise a number of connection wells connecting the ISO well and the base well(s) to each other, wherein the connection wells have a width, and the number and width of the connection wells are configured to provide a predetermined resistance between the ISO ring and the at least one emitter finger.

According to still another embodiment of the present disclosure, there is provided an ESD protection device including an N-type buried layer including a first dopant type in a semiconductor substrate; a deep well (DNW) including a first dopant type on the N-type buried layer; a first doped region including a first dopant type on the deep well; a second doped region including a first dopant type and a third doped region including a second dopant type, spaced apart from the first doped region; an ISO ring in the first doped region, configured to function as a base, and a multi-finger structure comprising emitter fingers and collector fingers; and base moats on opposite sides of the emitter fingers in a longitudinal direction; the base moats comprising a base metal connecting the emitter fingers to each other.

According to still another embodiment of the present disclosure, there is provided a method of manufacturing an ESD protection device including forming an N-type buried layer in a semiconductor substrate; forming a deep well (DNW) in the semiconductor substrate; forming first to third doped regions in the semiconductor substrate; forming one or more isolation layers to separate the first to third doped regions; forming an ISO ring that functions as a base, and one or more base moats around emitter fingers and collector fingers, or on opposite sides of the emitter fingers; forming contact terminals on the ISO ring, the emitter fingers, and the collector fingers; and connecting the emitter fingers to each other with metal.

The metal may form a mutually connected base node.

The method may further comprise forming an external resistor between the mutually connected base node and the emitter fingers.

Forming the ISO ring may include connecting a base well and an ISO well to each other with a well layer for at least one of the emitter fingers, and a resistance between the ISO ring and the emitter fingers may be adjusted according to a number and width of the well layer(s).

Forming the ISO ring may include forming the metal on opposite sides of the emitter fingers in a longitudinal direction, and connecting the emitter fingers on each of the opposite sides of the emitter fingers to each other with the metal.

According to the present disclosure, by protecting high-voltage input/output (I/O) terminals or power terminals against ESD events and other stress, it is possible to mitigate performance degradation due to operational instability.

According to the present disclosure, by ensuring uniform turn-on characteristics, it is possible to provide stable performance and improve device efficiency.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
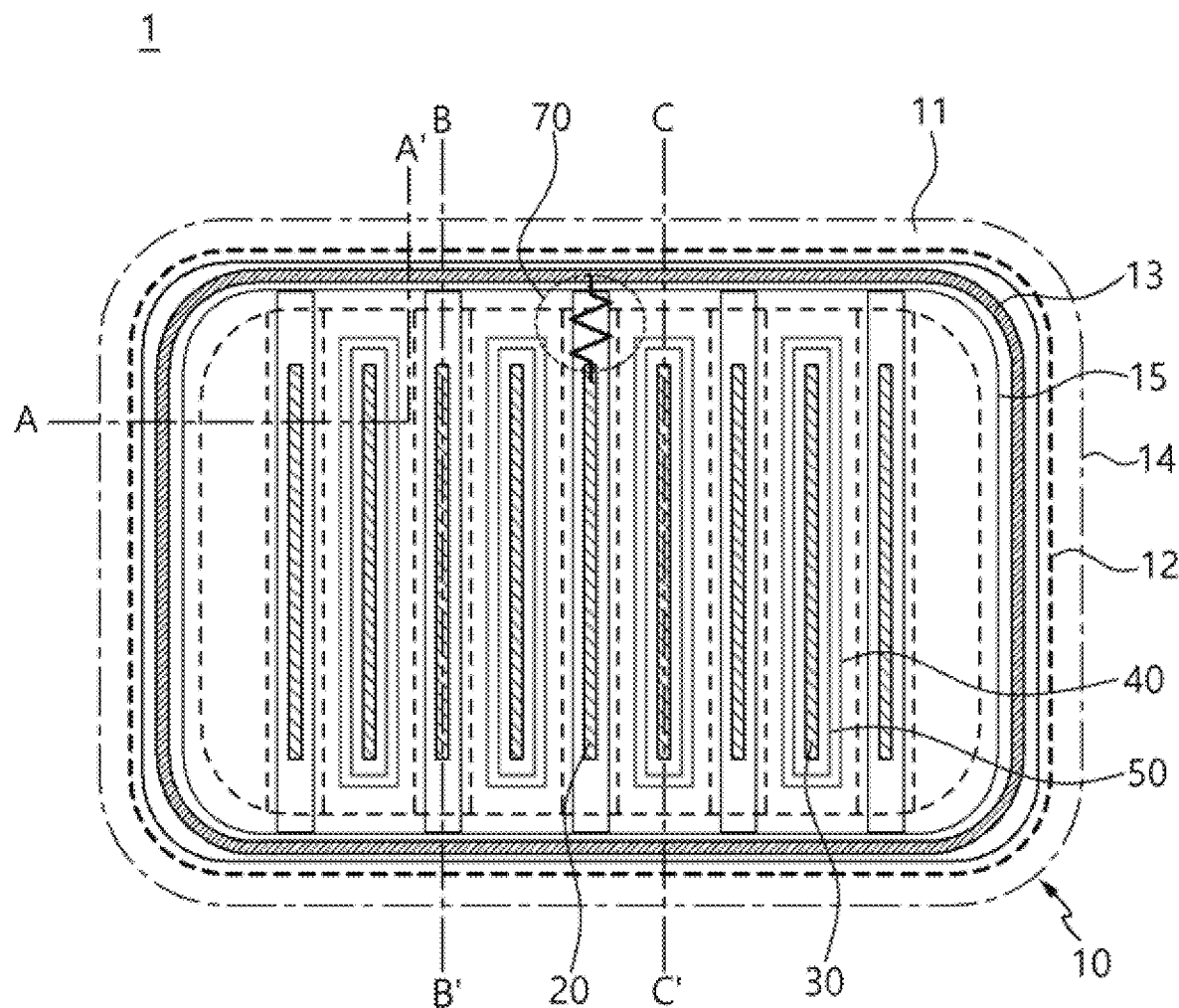
FIG. 1 is a layout of a typical PNP-based ESD protection device.

Objectives and effects of the present disclosure, and technical configurations for achieving them will become clear with reference to embodiments described later in detail in conjunction with the accompanying drawings. In describing the present disclosure, if it is determined that a detailed description of a known function or configuration may unnecessarily obscure the gist of the present disclosure, the detailed description will be omitted.

In addition, terms to be described later are terms defined in consideration of functions in the present disclosure, which may vary according to the intention of a user or operator, or custom.

The present disclosure is not limited to the embodiments disclosed below and may be implemented in various other forms. The embodiments are provided only to complete the disclosure of the invention and to fully inform those skilled in the art of the scope of the invention, and the present disclosure will be defined by the scope of the claims. Therefore, the definition should be made based on the contents throughout this specification.

Hereinafter, the present disclosure will be described in more detail based on the embodiments shown in the drawings.

Prior to describing the present disclosure, a typical PNP-based ESD protection device will be described with reference to FIGS. 1 to 3.

Figure 2A:
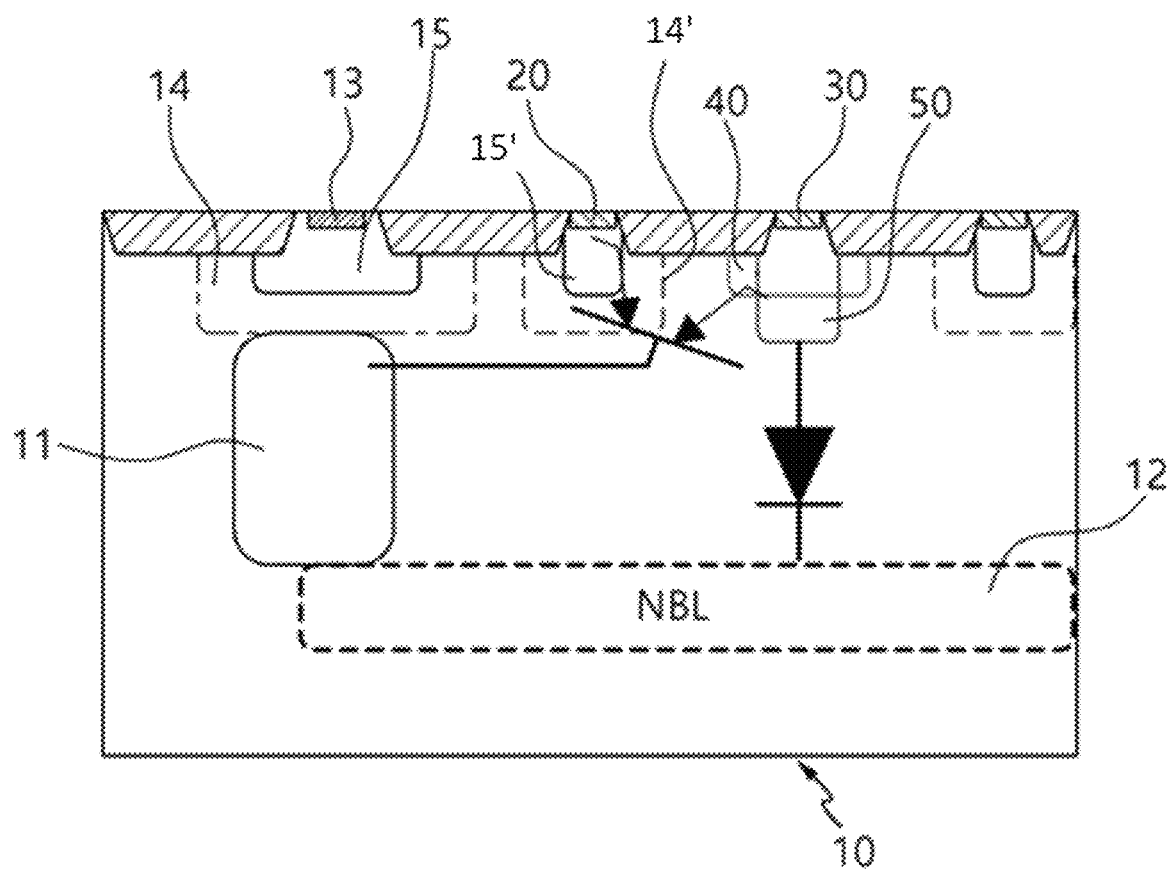
FIGS. 2A to 2C are cross-sectional views taken along line A-A', line B-B', and line C-C', respectively, in FIG. 1.
Figure 2B:
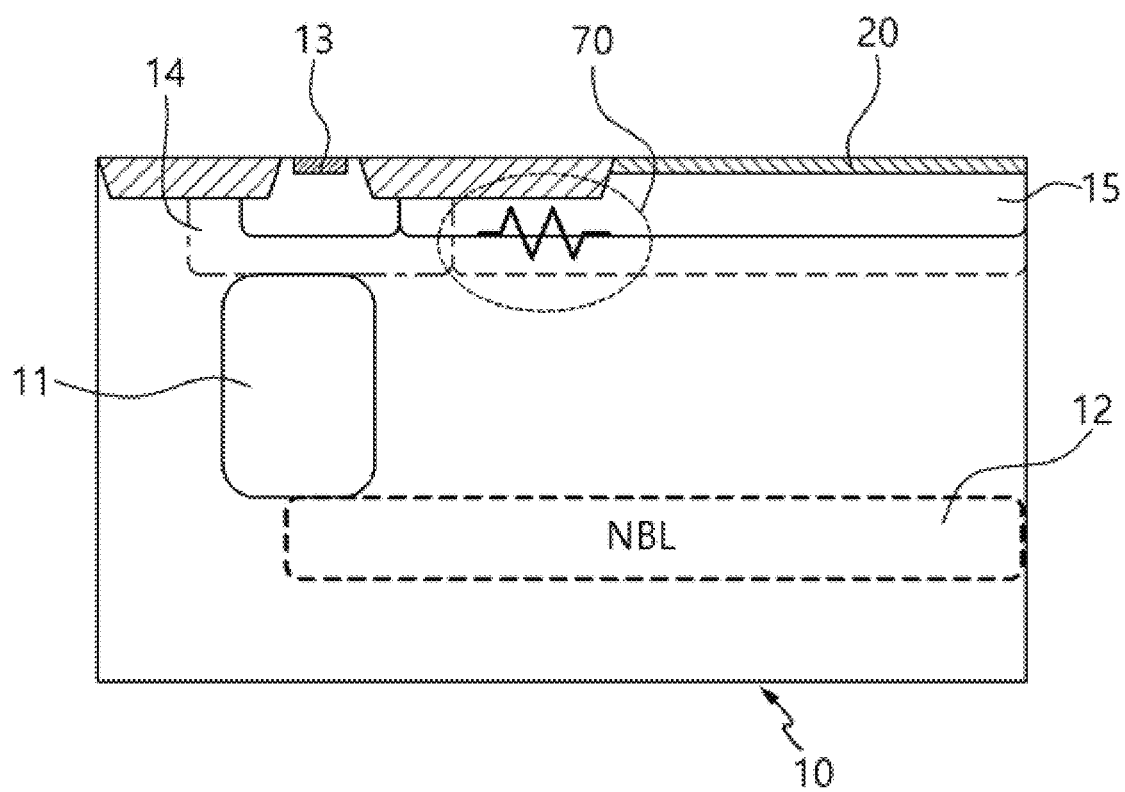
Figure 2C:
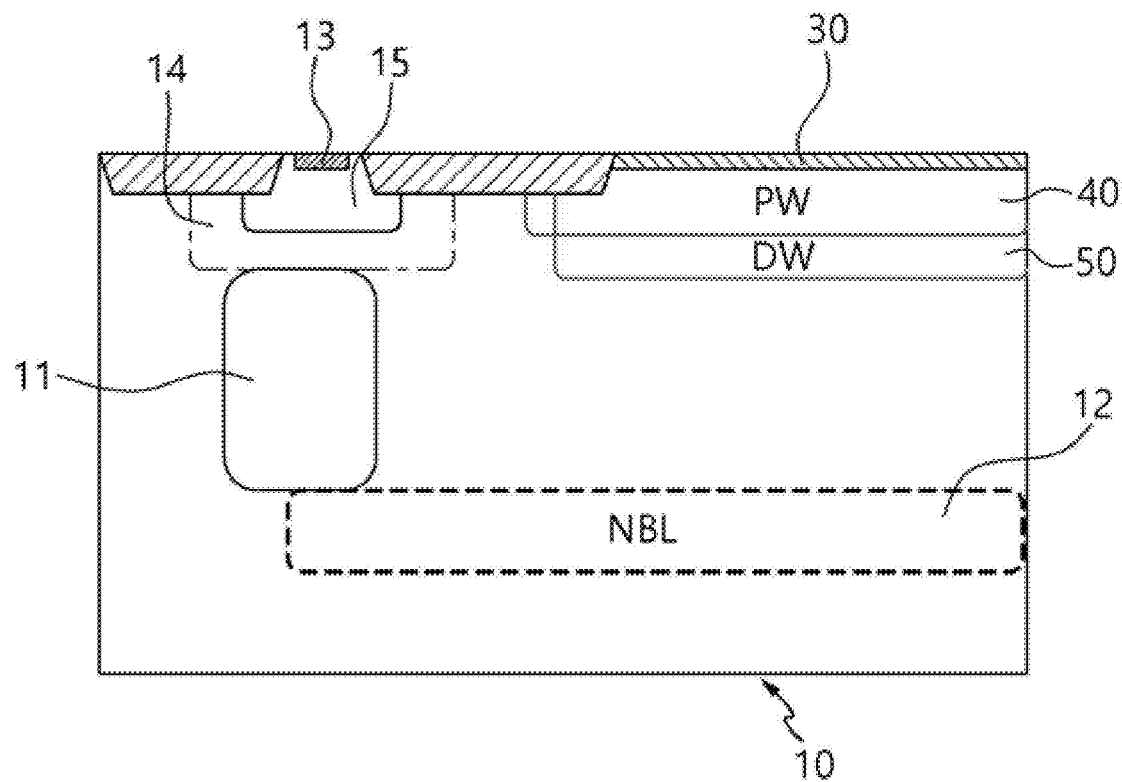

FIG. 1 is a layout of a typical PNP-based ESD protection device; FIGS. 2A to 2C are cross-sectional views taken along line A-A', line B-B', and line C-C', respectively, in FIG. 1; and FIG. 3 is an equivalent circuit diagram of the emitter finger-ISO well shown in FIG. 1.

Referring to FIG. 1, in the plan view of a conventional PNP-based ESD protection device 1, an N-type buried layer (NBL) 12 including an N-type dopant is in a semiconductor substrate 10, and a deep well (DNW), an N-type diffusion region (NSD) 13, a first N-well (NDT) 14, and a second N-well (NW) 15 are on the N-type buried layer 12. The N-type diffusion region (NSD) 13 may form an ISO ring structure and may function as a base (e.g., of the PNP transistor). The ISO ring 13 may have the shape of a ring (e.g., a square or rectangle with rounded corners) surrounding a PNP device (e.g., the PNP transistor) having multiple emitters and collectors (e.g., each in the form of fingers), which will be described later. The doping concentration of the second N-well 15 may be higher than that of the first N-well 14.

In a central portion or area of the semiconductor substrate 10, an emitter 20 and a collector 30, which comprise P-type diffusion regions including a P-type dopant, are side by side to form a multi-finger structure. The emitter 20 and the collector 30 may be referred to as an emitter finger 20 and a collector finger 30. The collector finger 30 is in a first P-well (PW) 40 and a second P-well (DW) 50. The second P-well (DW) 50 may have a higher or lower concentration than the first P-well 40. The emitter finger 20 may also be in a first N-well 14' and a second N-well 15'.

In FIG. 1, the well surrounding the emitter finger 20 may be connected to or in contact with the second N well (NW) 15 surrounding the ISO ring 13. In addition, as shown in FIG. 3, each collector finger 30 and ISO ring 13 may form a diode, in which the ISO ring 13 and the emitter finger 20 may be connected to each other by a metal pattern.

In FIG. 1, the base 13, the emitter 20, and the collector 30 operate as a PNP bipolar transistor.

Referring to FIG. 2A, the N-type buried layer (NBL) 12 is in the semiconductor substrate 10, and the deep well (DNW) 11 is on the N-type buried layer (NBL) 12. In addition, the first N-well (NDT) 14 and the second N-well (NW) 15 having a higher concentration than the first N-well (NDT) 14 are on the deep well (DNW) 11, and the ISO ring 13 serving as a base of the PNP bipolar transistor is in the first N-well (NDT) 14 and the second N-well (NW) 15, at an uppermost surface of the substrate 10. The wells 40 and 50 doped with a P-type dopant are spaced apart from the ISO ring 13, and the collector 30 may be in the wells 40 and 50. The wells 14 and 15 doped with an N-type dopant are surround the ISO ring 13, and the emitter 20 may be in additional instances of the wells 40 and 50.

Referring to FIG. 2B, the N-type buried layer (NBL) 12 is in the semiconductor substrate 10, the deep well (DNW) 11 is on the N-type buried layer (NBL) 12, the first N-well (NDT) 14 is on the deep well (DNW) 11, and the second N-well (NW) 15 is in the first N-well (NDT) 14. In addition, the ISO ring 13 and the emitter 20 are in the uppermost part of the second N-well (NW) 15.

Referring to FIG. 2C, the N-type buried layer (NBL) 12 is in the semiconductor substrate 10, and the deep well (DNW) 11 is on the N-type buried layer (NBL) 12. The first N-well (NDT) 14 and the second N-well (NW) 15 are on the deep well (DNW) 11, and the first P-well (PW) 40 and the second P-well (DW) 50 are in the semiconductor substrate 10, spaced apart from the N-type buried layer (NBL) 12. In addition, the ISO ring 13 is in the second N-well (NW) 15 at the uppermost surface of the substrate 10, while the collector 30 is in the first P-well (PW) 40 at the uppermost surface of the substrate 10.

Referring to FIGS. 2A to 2C, one or more shallow trench isolation (STI) layers (not numbered or identified) for device isolation is in the semiconductor substrate 10. Each of the base, emitter and collector is separated by an STI layer, and each of the wells of one type (e.g., P-type) may be separated from wells of the other type (e.g., N-wells) by an STI layer.

In the ESD protection device 1, when a positive ESD event occurs at the connection between the ISO ring 13 and the emitter 20, a reverse bias is applied in or to the junction between the N-type well (ISO well) of the ISO ring 13 and the P-type well of the collector 30, and avalanche breakdown occurs. Thus, when a base current flows in the N-type well that surrounds the ISO ring 13 and connects to the emitter, a transistor comprising the emitter 20, the N-well base under the emitter 20, and the collector 30 is turned on. On the other hand, when a negative ESD event occurs, a forward bias is applied in or to the junction between the N-type well (ISO well) of the ISO ring 13 and the P-type well of the collector 30.

Accordingly, all of the PNP transistors configured in the ESD protection device 1 are turned on at the same time to allow a high ESD current to flow, thereby providing high ESD protection to associated or connected circuitry.

However, this is true only when all fingers turn.

Figure 3:
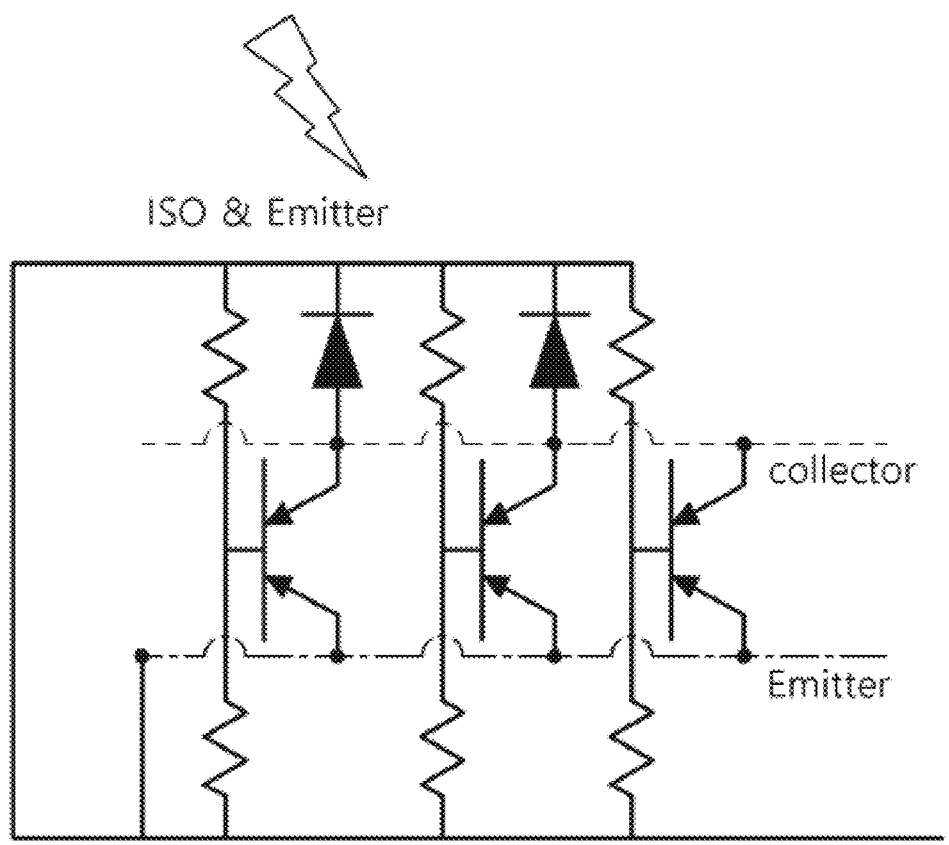
FIG. 3 is an equivalent circuit diagram of FIG. 1.

As shown in FIGS. 1 and 3, since edge regions of the emitter finger 20 and the ISO well may be connected to each other through a well layer, base connection resistance exists. This may result in different base biases of the respective emitter fingers 20 in the ESD protection device 1.

In the ESD protection device 1 of FIG. 1, the base connection resistor indicated by reference numeral 70 has a resistance in the range of 100 to 10 KΩ. Thus, even if one finger turns on within 100 ns (a time period in which the ESD protection device 1 should normally operate when an ESD event occurs or ESD stress is applied), it cannot be guaranteed that all fingers turn on at the same time. That is, in a typical multi-finger structure, when an ESD event occurs, some emitter fingers may not turn on.

For this reason, uniform bipolar transistor activity does not occur at all fingers, and bipolar transistor activity in only some fingers may occur locally. In addition, when the base connection resistor 70 is connected to a high-concentration well (e.g., the second N-well 15), a triggering voltage (e.g., of one or more of the PNP transistors) may rise higher than a breakdown voltage (e.g., of one or more of the PNP transistors) because the base resistance is low, and a turn-on voltage of the ESD protection device 1 may increase. This means that other devices may be triggered before the ESD protection device 1 is turned on, and may be damaged before the ESD protection device 1 can protect them.

As such, in the ESD protection device 1 using a bipolar transistor with a multi-finger structure, when uniform turn-on characteristics are not ensured, it is difficult to ensure stable performance of the device 1.

An objective of the present disclosure is to improve operational stability of an ESD protection device by enabling all fingers to turn on simultaneously (e.g., at the same time).

Figure 4:
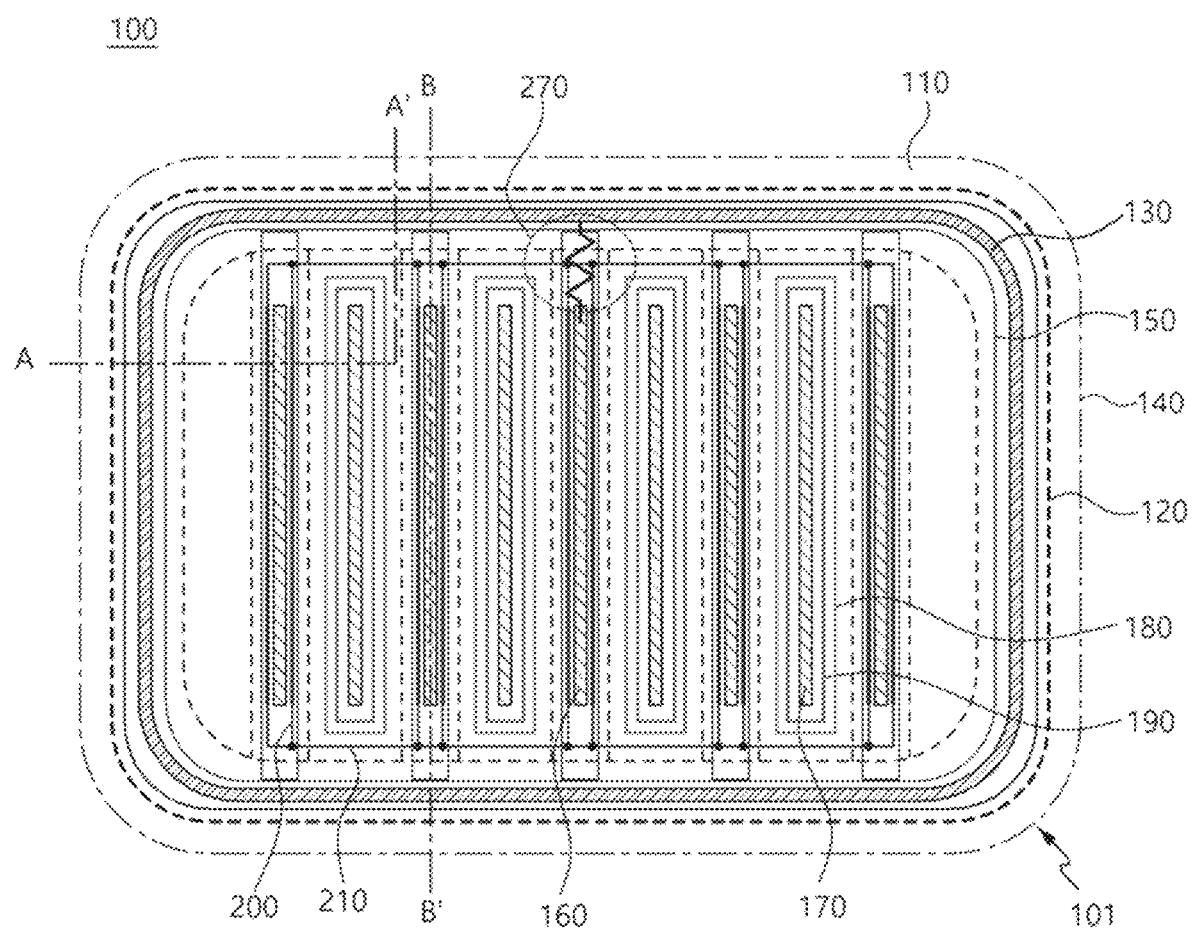
FIG. 4 is an ESD protection device according to an embodiment of the present disclosure.
Figure 5A:
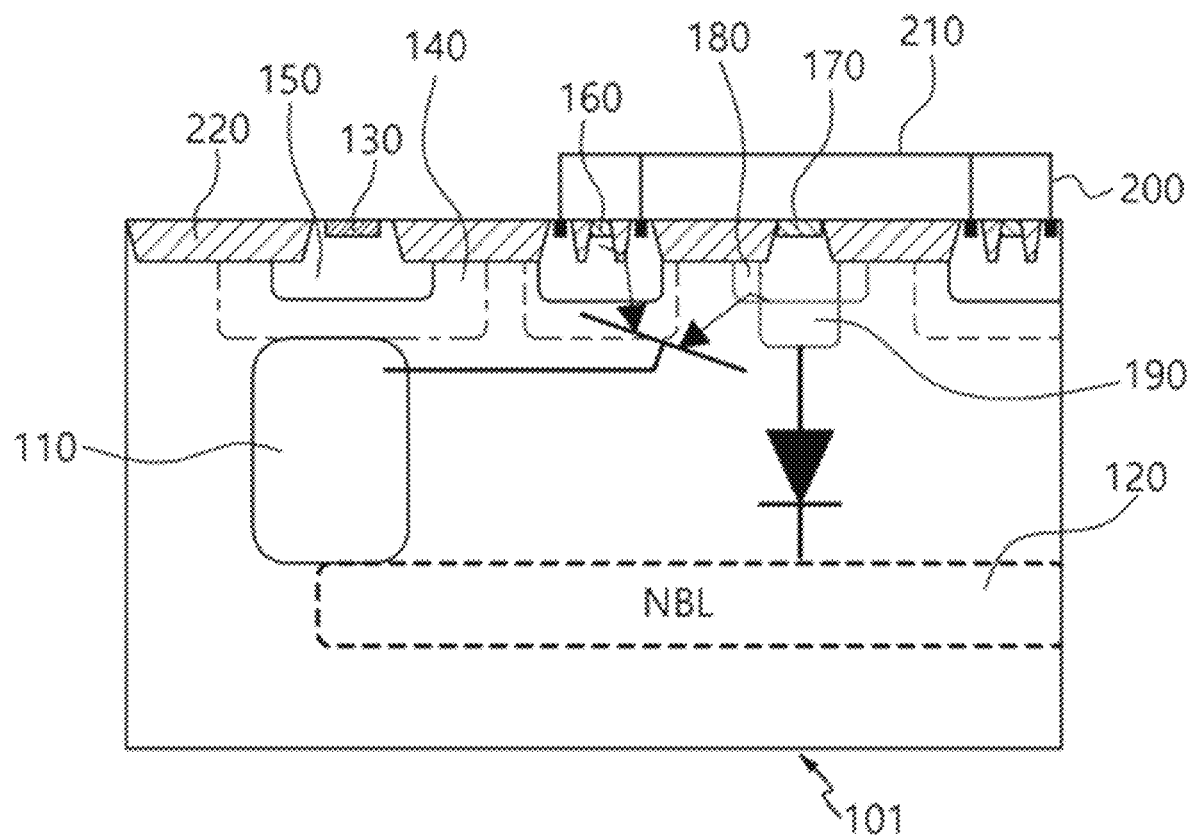
FIGS. 5A and 5B are cross-sectional views taken along line A-A' and line B-B', respectively, in FIG. 4.
Figure 5B:
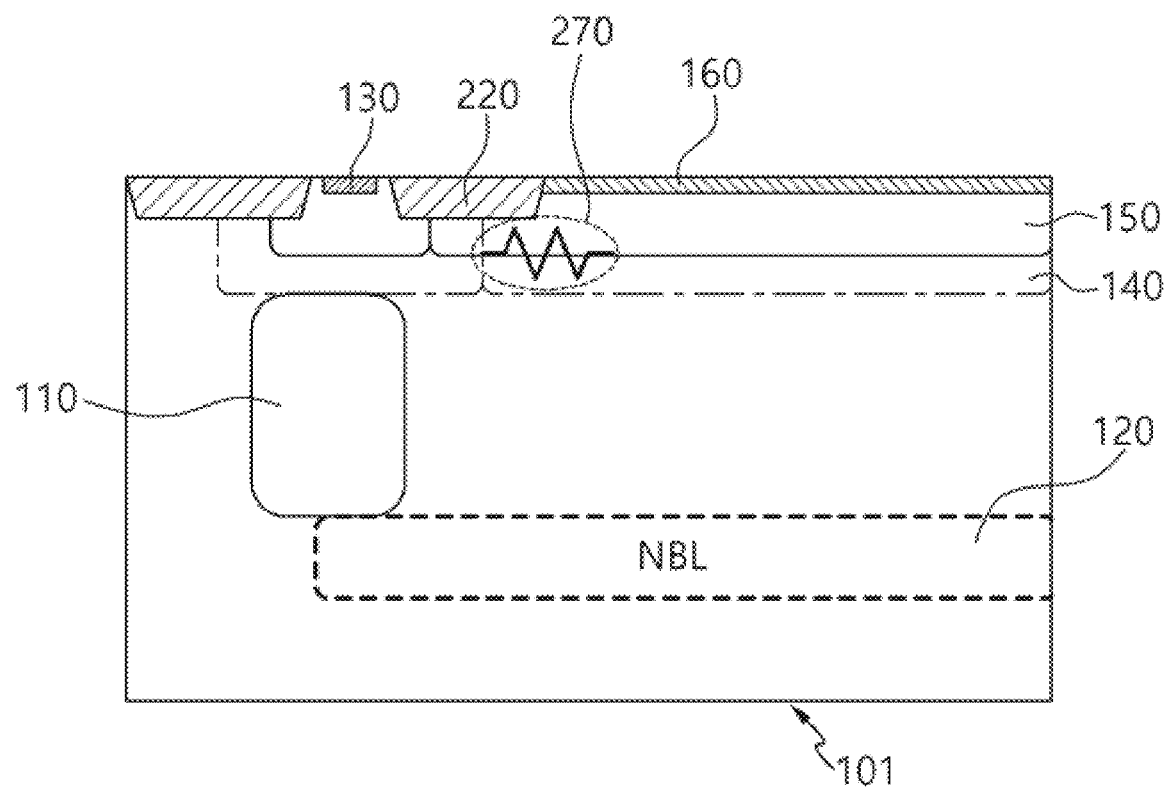
Figure 6:
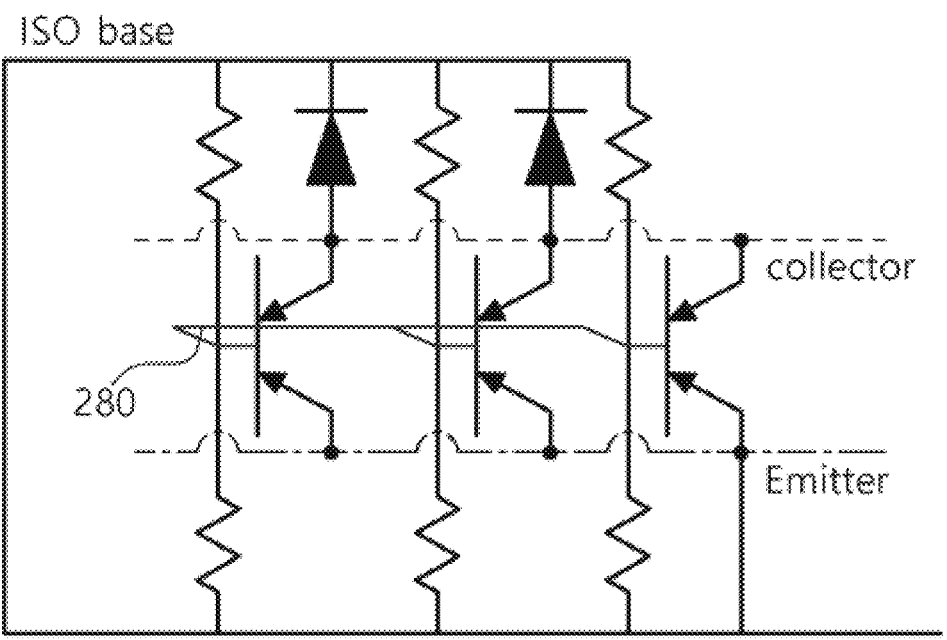
FIG. 6 is an equivalent circuit diagram of FIG. 5A.

FIG. 4 is an ESD protection device according to a first embodiment of the present disclosure; FIGS. 5A and 5B are cross-sectional views taken along line A-A' and line B-B', respectively, in FIG. 4; and FIG. 6 is an equivalent circuit diagram of FIG. 5A.

The layout of the ESD protection device shown in FIG. 4 and the cross-sectional views shown in FIGS. 5A and 5B are similar to the views shown in FIGS. 1 to 2C described above. Accordingly, the description of the same components, elements and/or configurations may be omitted, and the focus will be on the differences. This is because the component(s), element(s) and/or configuration(s) different from the conventional device may be technical features of the present disclosure.

As shown in FIGS. 4 to 5B, in an ESD protection device 100 of the present disclosure, an N-type buried layer (NBL) 120 comprising an N-type dopant is in a semiconductor substrate 101, and a deep well (DNW) 110, an N-type diffusion region (NSD) 130, a first N-well (NDT) 140, and a high-concentration second N-well (NW) 150 are on the N-type buried layer (NBL) 120. The first N-well (NDT) 140 is on the deep well (DNW) 110, the high-concentration second N-well (NW) 150 is in the first N-well (NDT) 140, and the N-type diffusion region (NSD) 130 is in the high-concentration second N-well (NW) 150, at an uppermost surface of the substrate 101. The N-type diffusion region (NSD) 130 has a ring structure and may function as a base (e.g., of a PNP transistor). Thus, the first N-well (NDT) 140 and the second N-well (NW) 150 may be components in or of a base well.

In a central portion or area of the semiconductor substrate 101, one or more emitters (emitter fingers) 160 and one or more collectors (collector fingers) 170, which each comprise a P-type diffusion region doped with a P-type dopant, are side by side (and, when a plurality of emitters 160 and collectors 170 are present, alternatingly so) to form a multi-finger structure. The collector 170 is in a first P-well (PW) 180 and a second P-well (DW) 190. The first P-well (PW) 180 surrounds an uppermost part of the second P-well (DW) 190, but has a depth less than that of the second P-well (DW) 190. The second P-well (DW) 190 has a higher concentration of dopant than the first P-well 180. The emitter 160 is in second instances of the first N-well 140 and the second N-well 150.

According to the first embodiment of the present disclosure, in the plan view of FIG. 4, a base moat 200 (e.g., an individual pattern) surrounds the emitter 160 (e.g., laterally, or from the side). Individual base moats 200 may be interconnected together. A base metal 210, with or without vias (not shown), or a series of contact structures (e.g., on the uppermost surface of the substrate 101 and/or in and/or on a pre-metal dielectric layer [not shown] on the substrate 101) may electrically connect the base moats 200.

Reference numeral 270 denotes a base connection resistor.

Referring to FIG. 5A, each emitter finger 160 may comprise a base moat 200, and the base moats 200 are electrically connected by the base metal 210. In general, all of the base moats 200 are connected. The base metal 210 is in a floating state, without being connected to any terminal or device capable of driving a voltage (e.g., VDD, ground, etc.). In addition, at least one of the emitter fingers 160 is connected to the ISO ring 130 (e.g., through the first N-well 140 and the second N-well 150 [e.g., the resistor 270] as shown in FIG. 5B).

On and/or in the semiconductor substrate 101, an STI layer 220 for device isolation may separate each well of one type from the well(s) of the other type.

In the above configuration(s) of the first embodiment, the ISO ring 130 and a base well under each emitter finger 160 may be connected by a well of the same type as the base well. Although the base wells of the emitter fingers 160 are independently connected to the ISO ring 130 (e.g., see FIG. 5B), due to the base moats 200 being connected by the base metal 210, a mutually connected base node 280 may be represented in the equivalent circuit diagram shown in FIG. 6. Thus, when the base well of any one of the fingers operates at a voltage different from that of the ISO ring 130 or the emitter 160 (e.g., during an ESD event), the base wells of all fingers 160 and 170 operate with the same triggering voltage. Accordingly, the PNP bipolar transistors formed by all of the fingers 160 and 170 are simultaneously triggered to ensure uniform turn-on characteristics of the ESD protection device 100.

Moreover, the connection resistance between the ISO ring 130 and the base well may be adjusted.

Figure 7A:
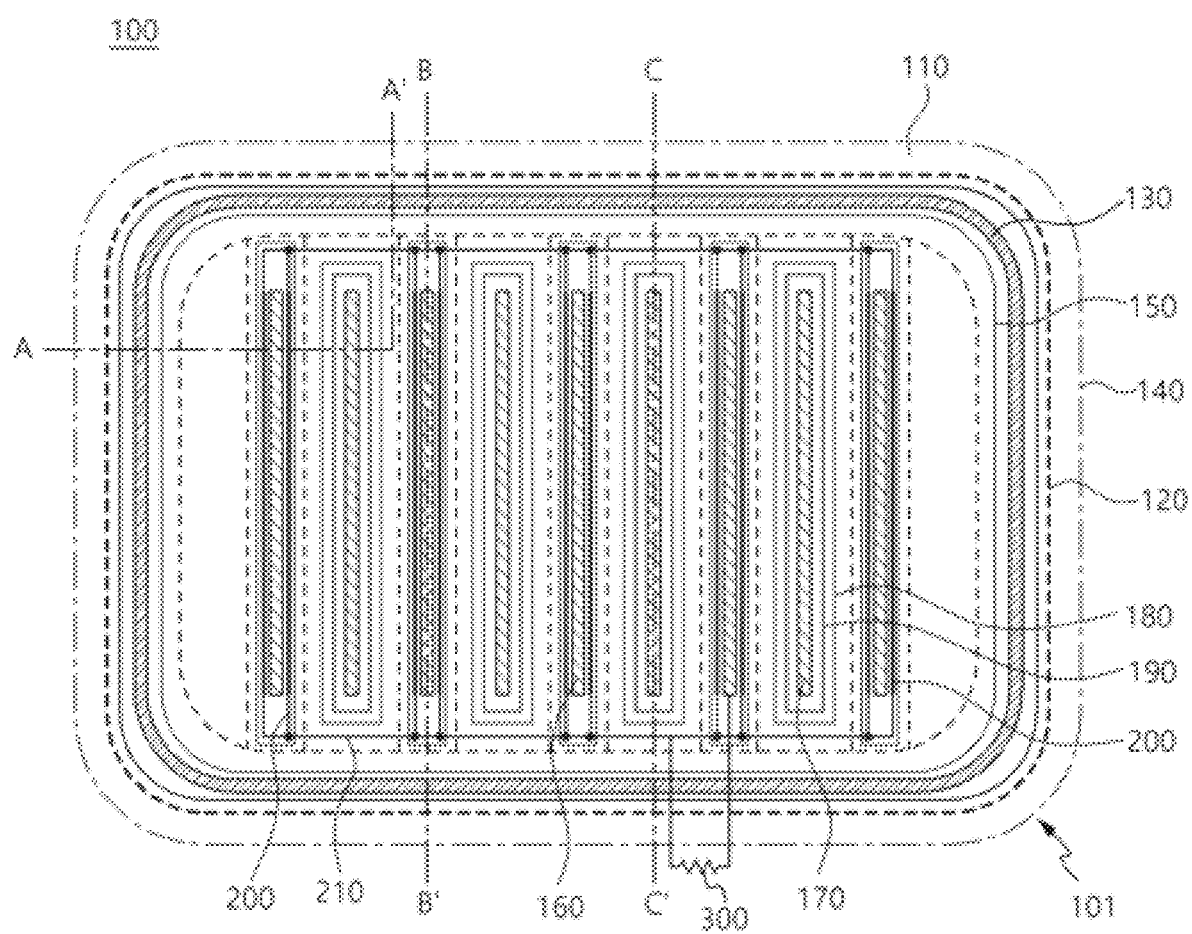
FIG. 7A is a layout of an ESD protection device according to a second embodiment of the present disclosure.
Figure 7B:
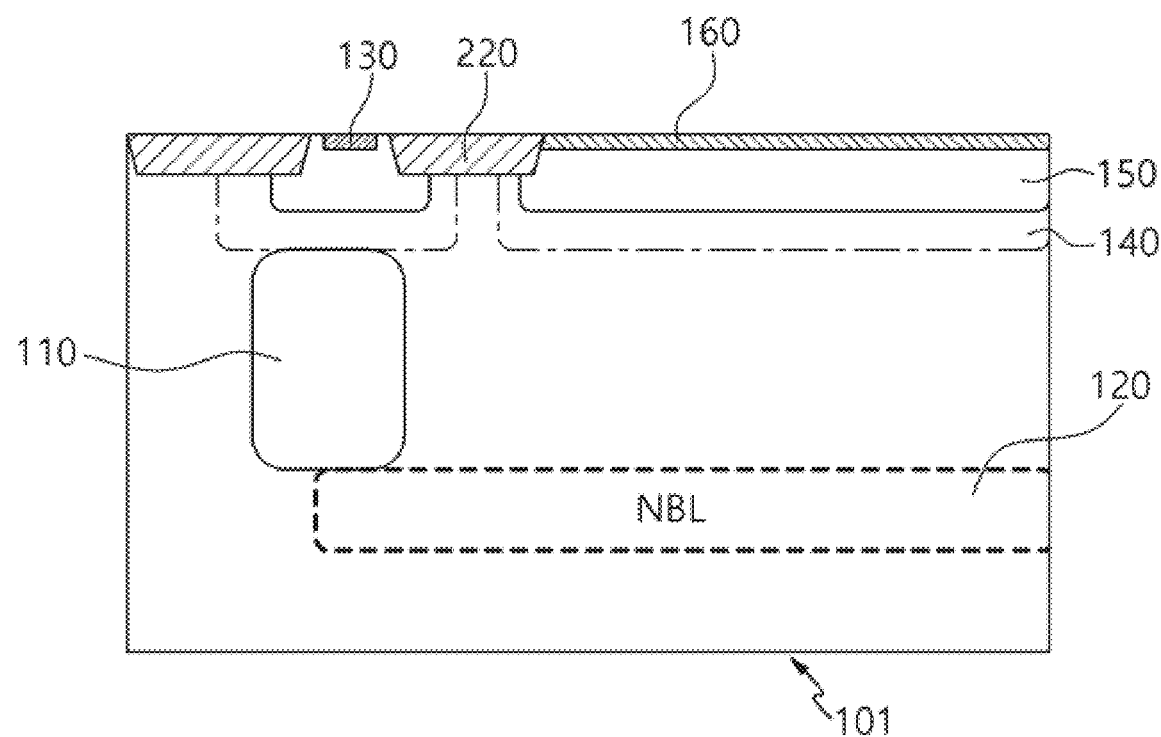
FIG. 7B is a cross-sectional view taken along line B-B' in FIG. 7A.
Figure 8:
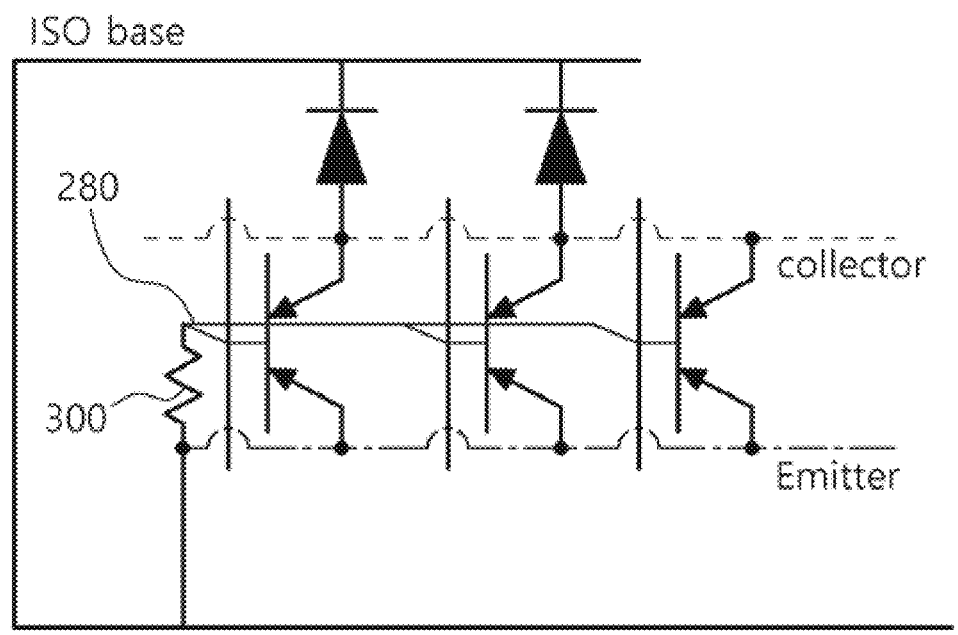
FIG. 8 is an equivalent circuit diagram of FIGS. 7A and 7B.

FIG. 7A is a layout of an ESD protection device according to a second embodiment of the present disclosure; FIG. 7B is a cross-sectional view taken along line B-B' in FIG. 7A; and FIG. 8 is an equivalent circuit diagram of the ESD protection device in FIGS. 7A and 7B.

Compared to the first embodiment, the second embodiment of the present disclosure has the same overall structure. However, the well layer including the ISO well 140 and 150 is not connected to or in contact with the base well 140 and 150 under each emitter finger 160. Another difference is that the ESD protection device 100' in FIGS. 7A and 7B further includes an external base resistor 300 between the mutually connected base node 280 and the emitter 160.

The external base resistor 300 may comprise any of various materials and various structures. For example, the base resistor 300 may comprise a poly resistor, a diffusion resistor, a well resistor, a salicide resistor, a metal resistor, etc., electrically connecting the base metal 210 to one or more emitter fingers 160. The dimensions and/or composition of the external base resistor 300 may be adjusted to adjust the triggering voltage of the PNP transistor.

In the case of an ESD protection device according to a third embodiment of the present disclosure, compared to the second embodiment of FIGS. 7A and 7B described above, the difference is that, although not shown in the drawings, an ISO well and a base well are connected by a well layer of the same type (e.g., a connection well) in at least one of the emitter fingers 160, without using the external base resistor 300.

In this structure, the resistance between the base 130 and the emitter(s) 160 may be adjusted according to the number and width of connection wells in the circuit.

Figure 9:
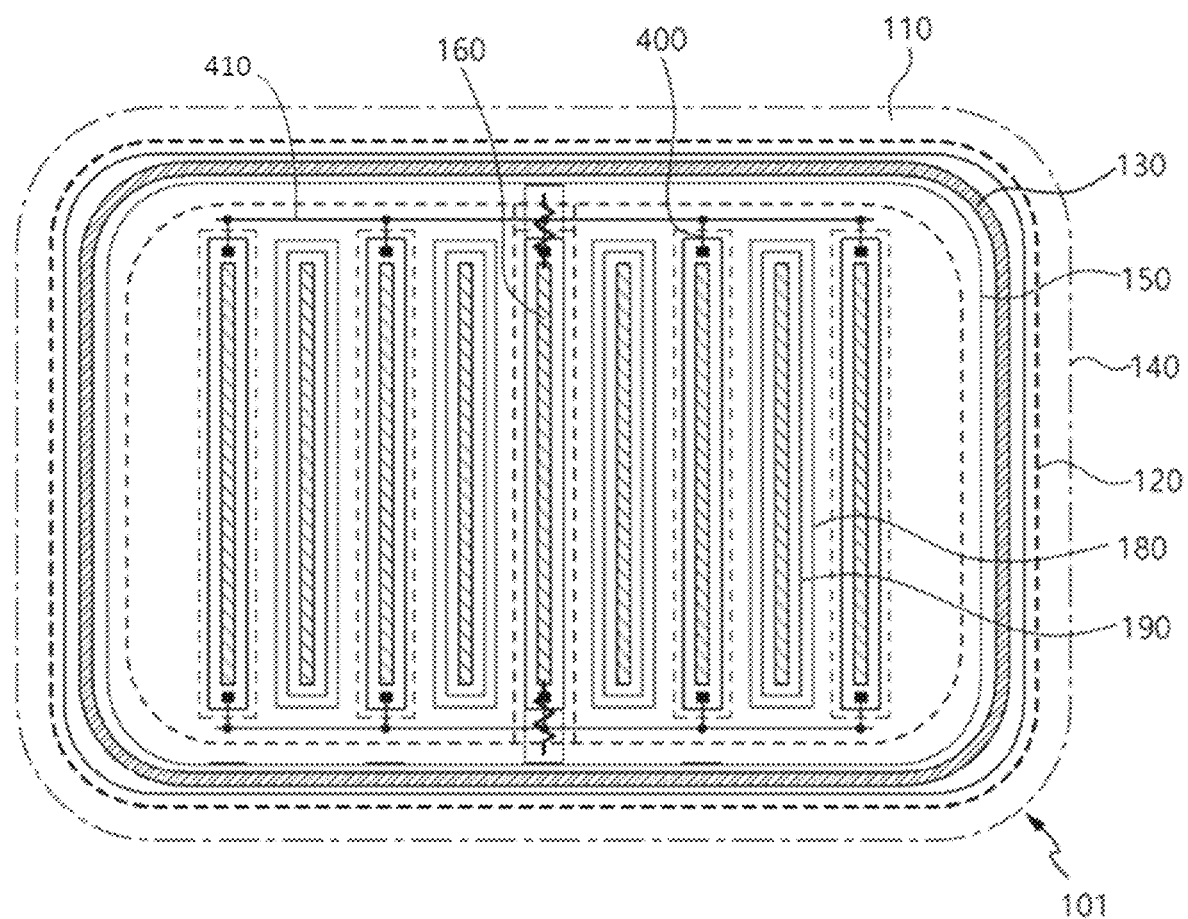
FIG. 9 is a layout of an ESD protection device according to a third embodiment of the present disclosure.

FIG. 9 is a layout of an ESD protection device according to the third embodiment of the present disclosure.

In the third embodiment of the present disclosure, the base moat 400 does not form a ring around the emitter fingers 160, but rather, is only at the longitudinal ends of the emitter fingers 160. In addition, the individual base moats 200 are interconnected together by the base metal 410 at the opposite ends of the emitter fingers 160. It is a different configuration from the first and second embodiments described above.

Operations of the third embodiment are substantially the same as those of the ESD protection device according to the first embodiment of FIG. 4 described above.

As such, the present disclosure includes the structures of the ESD protection devices according to the first to third embodiments, in which all emitter fingers of the ESD protection device turn on at the same time to improve operation stability and effectiveness of the device.

FIGS. 10A to 10E are views showing structures formed during an exemplary manufacturing process of the present ESD protection device(s).

Figure 10A:
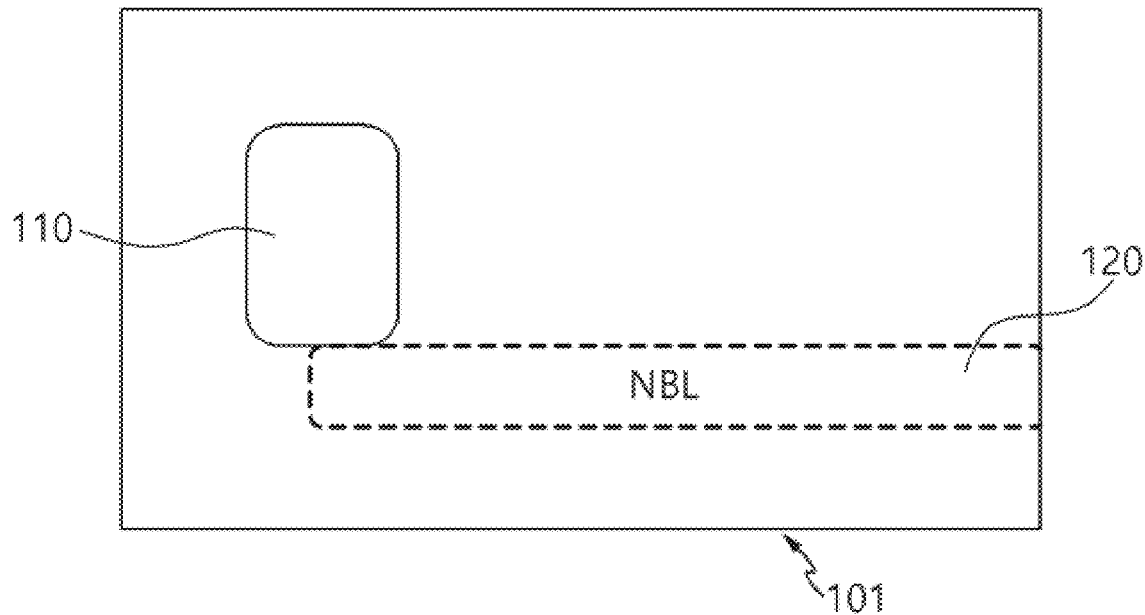
FIGS. 10A to 10E are views showing structures formed in an exemplary process of manufacturing the ESD protection devices of the present disclosure.

Referring to FIG. 10A, an N-type buried layer (NBL) 120 is formed in a semiconductor substrate 101, for example by ion implantation into a single-crystal silicon substrate having an uppermost surface substantially coincident with the uppermost surface of the N-type buried layer 120. Then, an epitaxial layer is formed thereon by epitaxial growth (e.g., using plasma, heat, and silane gas). Since the epitaxial layer has the same conductivity type as the semiconductor substrate 101, the combination of the substrate and the epitaxial layer may be regarded as one semiconductor substrate 101. Thereafter, an N-type dopant is further implanted into the epitaxial layer through a photolithographically-patterned photoresist mask to form a deep well (DNW) 110. A further epitaxial layer may be grown thereon.

Figure 10B:
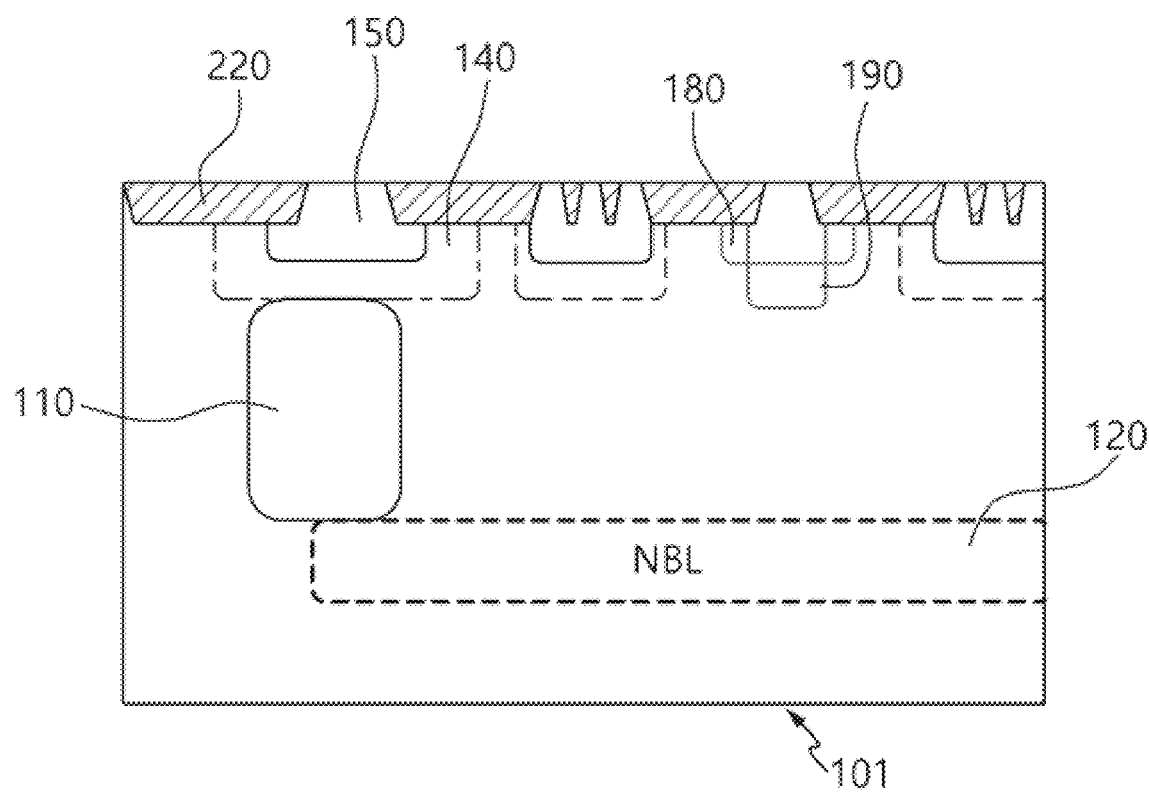

Referring to FIG. 10B, a plurality of STI layers 220 configured to electrically isolate various wells are formed in the substrate 101 at ah uppermost surface thereof (e.g., by shallow trench isolation), and wells 140, 150, 180 and 190 for a base 130, an emitter 160 and a collector 170 are formed between and in part below the STI layers 220 by ion implantation using corresponding photolithographically-patterned photoresist masks. For example, after forming the first N-wells (NDT) 140 for the emitters 160 and the base 130, the same or different N-type dopant is further implanted through a different mask and generally at a different (higher) dose and a different (lower) energy to form the high-concentration second N-wells (NW) 150. To form the wells 180 and 190 for the collector 170, a P-type dopant is implanted through a third mask into the corresponding region to form the first P-well (PW) 180, and a higher concentration of the same or different P-type dopant is implanted through a different mask (with narrower openings) at a different (higher) energy to form the second P-well (DW) 190. Conversely, the wells 140, 150, 180 and 190 may be formed first, and then the STI regions 220 may be formed thereafter.

Figure 10C:
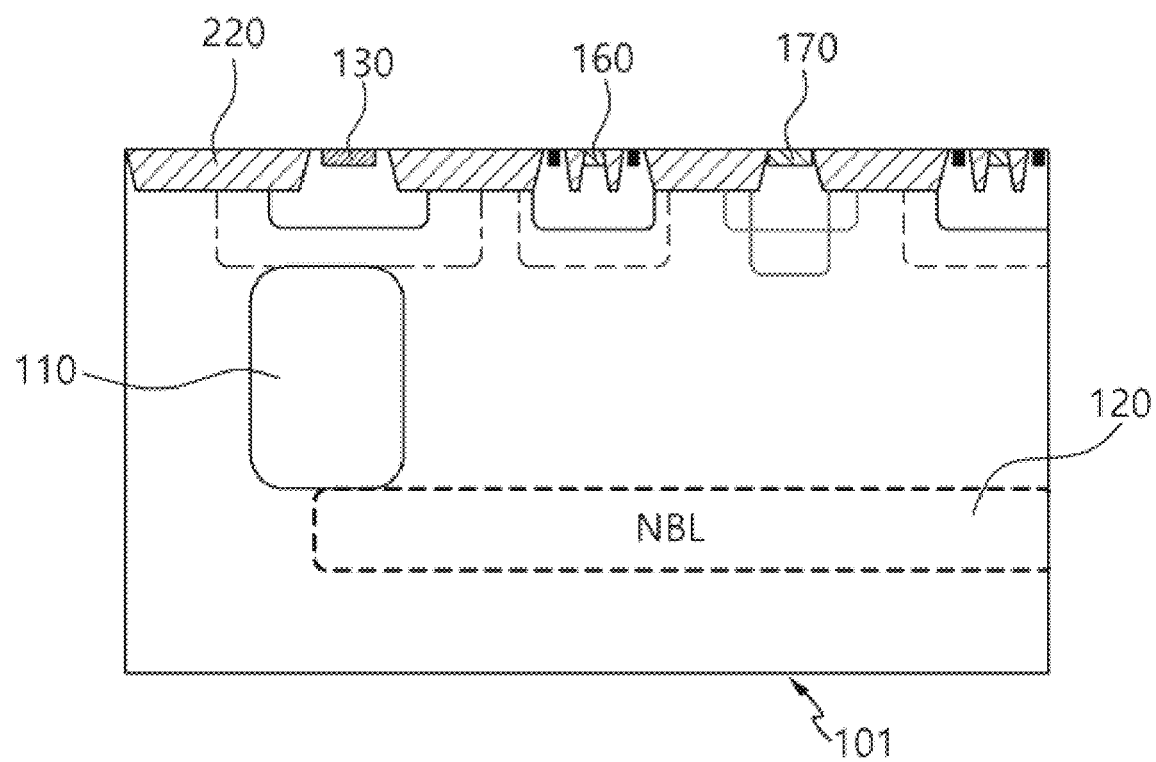

Referring to FIG. 10C, the base 130, the emitter 160, and the collector 170 are formed in the respective wells 140 and 190 by respectively (and separately) implanting an N-type dopant and a P-type dopant through respective photolithographically-patterned photoresist masks.

Figure 10D:
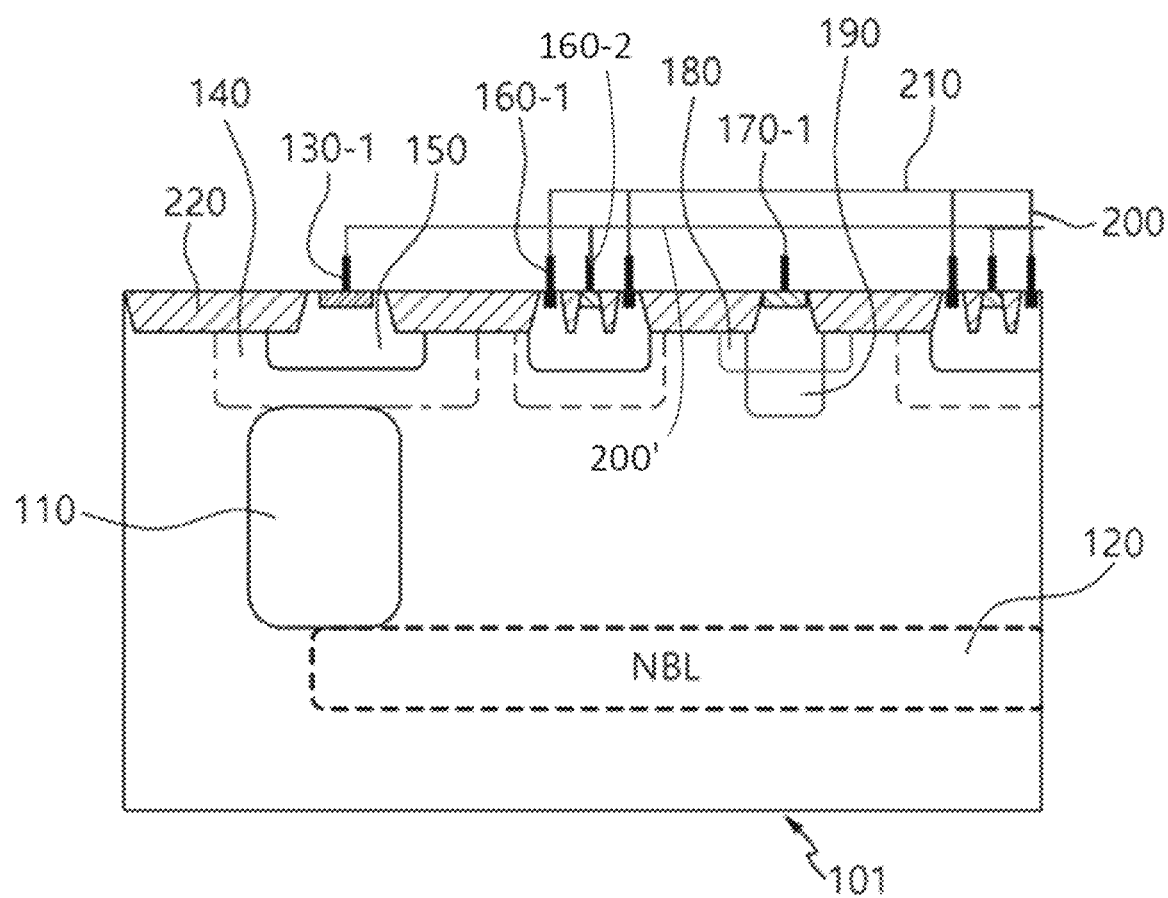

Referring to FIG. 10D, a base moat 200 is formed to electrically connect each of the high-concentration second N-wells 150 surrounding the emitters 160, and an optional metal connection structure 200' may be formed to electrically connect the base region 130 and the emitters 160. Corresponding contact terminals 130-1, 160-2, 170-1 and 160-1 are formed (e.g., by conventional contact formation in a pre-metal dielectric layer on the substrate 101) to the base 130, emitters 160, collectors 170, and N-wells 150, respectively. Thereafter, the base moat 200 is completed by forming a metallization structure 210 electrically connecting contact terminals 160-1, and the optional metal connection structure 200' may be completed by forming a second metallization structure 210' electrically connecting contact terminals 160-2 and 130-1. Other structures in the same layer of metal as the metallization structures 210 and 210' may form wires to the collector contacts 170-1.

The EDS protection device of the present disclosure may be manufactured using the exemplary process of FIGS. 10A to 10D, and the EDS protection devices manufactured in this way may include a mutually connected base node formed by the base moats 200 and 200', which improves the effectiveness and operational stability (uniform turn on) of the EDS protection device.

Figure 10E:
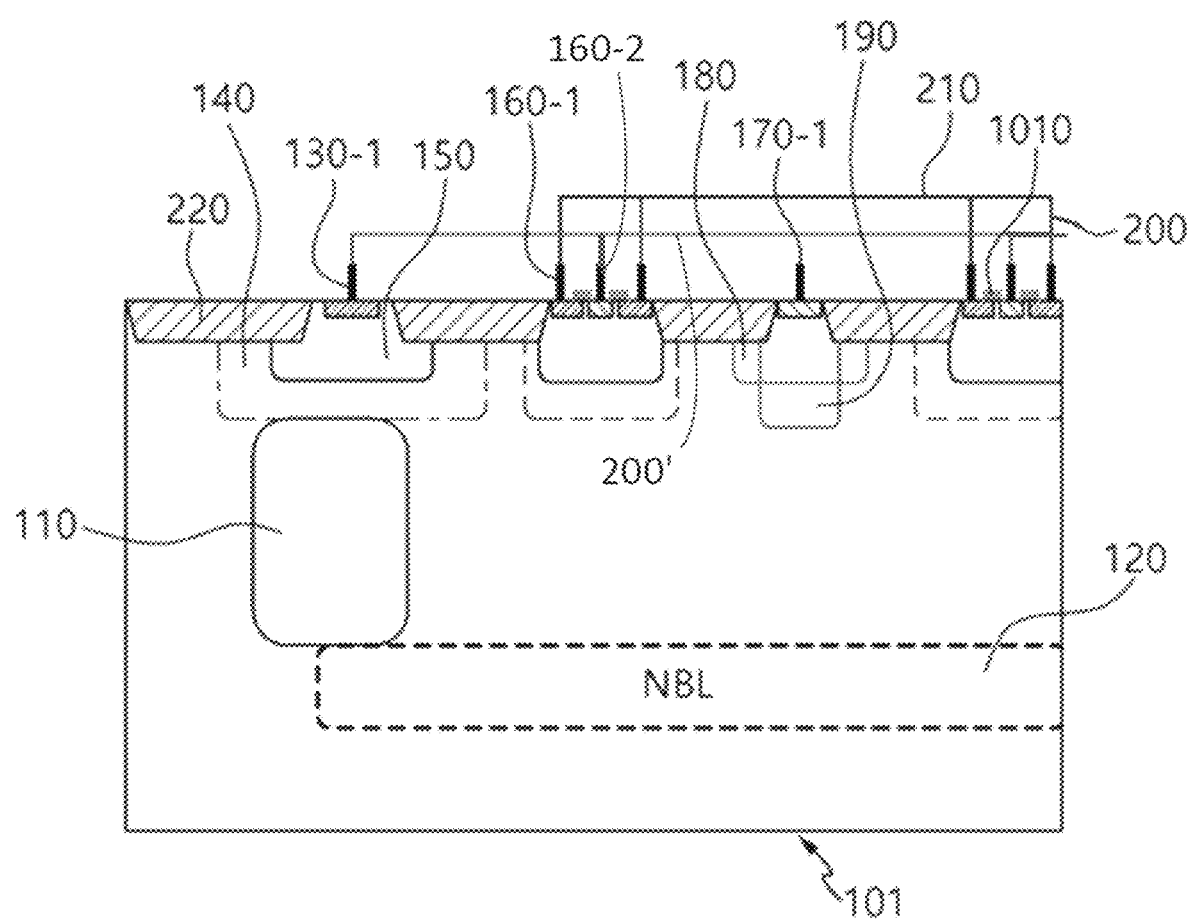

Meanwhile, in the present EDS protection device, it is also possible to include and/or form a nonsalicide layer 1010 as shown in FIG. 10E.

Although the nonsalicide layer 1010 may be formed in contact with the same emitters 160 as the base moat 200, the nonsalicide layer 1010 may play a role of electrical separation (e.g., between the base moat 200 and the base moat 200').

Although the present disclosure has been described with reference to the illustrated embodiments as described above, the embodiments are only exemplary. Those of ordinary skill in the art to which the present disclosure pertains will know that various modifications, changes, and other equivalent embodiments are possible without departing from the gist and scope of the present disclosure. Therefore, the true technical protection scope of the present invention should be determined by the technical spirit of the appended claims.

What is claimed is:

1. An electrostatic discharge (ESD) protection device, comprising:
   an N-type buried layer including a first dopant type in a semiconductor substrate;
   a deep well (DNW) including the first dopant type on the N-type buried layer;
   a first doped region including the first dopant type on the deep well;
   a second doped region including the first dopant type and a third doped region including a second dopant type, spaced apart from the first doped region;
   a base in the first doped region, and a multi-finger structure comprising emitter fingers in the second doped region and collector fingers in the third doped region; and
   a base moat comprising a base metal electrically connecting individual ones of the emitter fingers to each other;
   wherein the base metal is in a floating state.

2. The ESD protection device of claim 1, wherein the first doped region, the second doped region, and the third doped region each include a low concentration doped region and a high concentration doped region.

3. The ESD protection device of claim 1, wherein the base comprises a ring structure along a periphery of the multi-finger structure.

4. The ESD protection device of claim 3, wherein a well in the first doped region and under the ring structure is connected to a base well in the second doped region and under each emitter finger by a further well including the first dopant type.

5. The ESD protection device of claim 4, wherein when the base well under any one of the emitter fingers is driven with a first voltage different from that of the ring or other one(s) of the emitter fingers, all of the base wells are driven with the first voltage.

6. The ESD protection device of claim 3, wherein the emitter fingers and the ring are interconnected together.

7. The ESD protection device of claim 1, wherein the base moat further comprises a mutually connected base node.

8. The ESD protection device of claim 7, further comprising an external resistor between at least one of the emitter fingers and the mutually connected base node.

9. The ESD protection device of claim 8, wherein the external resistor controls a triggering voltage for triggering the base well below the at least one of the emitter fingers.

10. The ESD protection device of claim 8, wherein the external resistor comprises a poly resistor, a diffusion resistor, a well resistor, a salicide resistor, or a metal resistor.

11. An ESD protection device, comprising:
   an N-type buried layer including a first dopant type in a semiconductor substrate;
   a deep well (DNW) including the first dopant type on the N-type buried layer;
   a first doped region including the first dopant type on the deep well;
   a second doped region including the first dopant type and a third doped region including a second dopant, spaced apart from the first doped region;
   an ISO ring in the first doped region, configured to function as a base, and a multi-finger structure comprising emitter fingers and collector fingers; and
   a base moat comprising a base metal connecting individual ones of the emitter fingers to each other;
   wherein a base well in or below at least one of the emitter fingers is connected to a well in the first doped region and below the ISO ring.

12. The ESD protection device of claim 11, comprising a number of connection wells connecting the ISO well and the base well(s) to each other, wherein the connection wells have a width, and the number and width of the connection wells are configured to provide a predetermined resistance between the ISO ring and the at least one of the emitter fingers.

13. An ESD protection device, comprising:
- an N-type buried layer including a first dopant type in a semiconductor substrate;
- a deep well (DNW) including the first dopant type on the N-type buried layer;
- a first doped region including the first dopant type on the deep well;
- a second doped region including the first dopant type and a third doped region including a second dopant type, spaced apart from the first doped region;
- an ISO ring in the first doped region, configured to function as a base, and a multi-finger structure comprising emitter fingers and collector fingers; and
- base moats on opposite sides of the emitter fingers in a longitudinal direction, the base moats comprising a base metal connecting the emitter fingers to each other.

14. A method of manufacturing an ESD protection device, the method comprising:
- forming an N-type buried layer in a semiconductor substrate;
- forming a deep well (DNW) in the semiconductor substrate;
- forming first to third doped regions in the semiconductor substrate;
- forming one or more isolation layers to separate the first to third doped regions;
- forming an ISO ring that functions as a base, and one or more base moats around emitter fingers and collector fingers or on opposite sides of the emitter fingers;
- forming contact terminals on the ISO ring, the emitter fingers, and the collector fingers; and
- connecting the emitter fingers to each other with metal.

15. The method of claim 14, wherein the metal forms a mutually connected base node.

16. The method of claim 15, further comprising:
- forming an external resistor between the mutually connected base node and the emitter fingers.

17. The method of claim 14, wherein forming the ISO ring comprises connecting a base well and an ISO well to each other with a well layer for at least one of the emitter fingers, and
- a resistance between the ISO ring and the emitter fingers is adjusted according to a number and/or a width of the well layer(s).

18. The method of claim 14, wherein forming the ISO ring comprises forming the metal on opposite sides of the emitter fingers in a longitudinal direction, and connecting the emitter fingers on each of the opposite sides of the emitter fingers to each other with the metal.

19. The method of claim 14, further comprising:
- forming nonsalicide layers on or over the emitter fingers, wherein the nonsalicide layers are electrically isolated from the emitter fingers.

* * * * *